(12) United States Patent
Basol et al.

(10) Patent No.: US 6,943,112 B2
(45) Date of Patent: *Sep. 13, 2005

(54) DEFECT-FREE THIN AND PLANAR FILM PROCESSING

(75) Inventors: Bulent M. Basol, Manhattan Beach, CA (US); Cyprian Uzoh, San Jose, CA (US)

(73) Assignee: ASM NuTool, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/379,265

(22) Filed: Mar. 3, 2003

(65) Prior Publication Data

US 2004/0012090 A1 Jan. 22, 2004

Related U.S. Application Data

(63) Continuation-in-part of application No. 10/201,606, filed on Jul. 22, 2002.

(51) Int. Cl.[7] .............................................. H01L 21/44
(52) U.S. Cl. ...................... 438/687; 438/637; 438/678
(58) Field of Search ................................ 438/685–687, 438/678, 675, 672

(56) References Cited

U.S. PATENT DOCUMENTS

| 6,176,992 | B1 | | 1/2001 | Talieh | |
|---|---|---|---|---|---|
| 6,333,248 | B1 | * | 12/2001 | Kishimoto | 438/586 |
| 6,346,479 | B1 | * | 2/2002 | Woo et al. | 438/687 |
| 6,433,402 | B1 | | 8/2002 | Woo et al. | |
| 6,482,656 | B1 | * | 11/2002 | Lopatin | 438/2 |
| 6,492,260 | B1 | * | 12/2002 | Kim et al. | 438/631 |
| 6,566,259 | B1 | * | 5/2003 | Ding et al. | 438/687 |
| 6,620,725 | B1 | * | 9/2003 | Shue et al. | 438/633 |
| 2003/0119311 | A1 | * | 6/2003 | Basol et al. | 438/678 |
| 2004/0012090 | A1 | | 1/2004 | Basol et al. | |

FOREIGN PATENT DOCUMENTS

| EP | 1167585 | 1/2002 |
|---|---|---|
| JP | 11165253 | 6/1999 |
| JP | 2000208443 | 7/2000 |
| WO | WO 01 32362 | 5/2001 |
| WO | WO 0178135 | 10/2001 |
| WO | WO 03009361 | 1/2003 |

OTHER PUBLICATIONS

Reid et al., "Factors influencing damascene feature fill using copper PVD and electroplating." *Solid State Technology*, Jul. 2000, pp. 86–103.

* cited by examiner

*Primary Examiner*—Thanh Nguyen
(74) *Attorney, Agent, or Firm*—Knobbe, Martens, Olson & Bear LLP

(57) ABSTRACT

The process of the present invention forms copper interconnects in a semiconductor wafer surface. During the process, initially, narrow and large features are provided in the top surface of the wafer, and then a primary copper layer is deposited by employing an electrochemical deposition process. The primary copper layer completely fills the features and forms a planar surface over the narrow feature and a non-planar surface over the large feature. By employing an electrochemical mechanical deposition process, a secondary copper layer is deposited onto the primary copper layer to form a planar copper layer over the narrow and large features. After this process step, the thickness of the planar copper layer is reduced using an electropolishing process.

14 Claims, 10 Drawing Sheets

DEFECT-FREE THIN AND PLANAR FILM PROCESSING

RELATED APPLICATIONS

This application is a continuation in part of U.S. patent application Ser. No. 10/201,606, (NT-254) filed Jul. 22, 2002, entitled "Planar Metal Electrodeposition," which is expressly incorporated by reference herein.

FIELD

The present invention relates to manufacture of semiconductor integrated circuits and, more particularly to a method for planar deposition and polishing of conductive layers.

BACKGROUND

Conventional semiconductor devices generally include a semiconductor substrate, such as a silicon substrate, and a plurality of sequentially formed dielectric interlayers such as silicon dioxide and conductive paths or interconnects made of conductive materials. Copper and copper-alloys have recently received considerable attention as interconnect materials because of their superior electro-migration and low resistivity characteristics. The interconnects are usually formed by filling copper in features or cavities etched into the dielectric layers by a metallization process. The preferred method of copper metallization is electroplating. In an integrated circuit, multiple levels of interconnect networks laterally extend with respect to the substrate surface. Interconnects formed in sequential layers can be electrically connected using vias or contacts.

In a typical process, first an insulating layer is formed on the semiconductor substrate. Patterning and etching processes are performed to form features or cavities such as trenches and vias in the insulating layer. Then, a barrier/glue layer and a seed layer are deposited over the patterned surface and a conductor such as copper is electroplated to fill all the features. However, the plating process, in addition to filling the features with copper, also deposits excess copper over the top surface of the substrate. This excess copper is called an "overburden" and needs to be removed during a subsequent process step. In standard plating processes this overburden copper has a large topography since the Electrochemical Deposition (ECD) process coats large features on the wafer in a conformal manner. For example, a wafer with 0.5 micron deep features may be coated with 0.8 micron thick copper by the standard ECD process, to assure complete, defect-free filling of all the features, including those that are wider than about 5 microns. The resulting copper surface then may have a topography that has a step of about 0.5 microns over the large features. Conventionally, after the copper plating, CMP process is employed to first globally planarize this topographic surface and then to reduce the thickness of the overburden copper layer down to the level of the surface of the barrier layer, which is also later removed leaving conductors only in the cavities. CMP is a costly and time consuming process. High pressures used in the CMP processes also damage low-k dielectrics, which are mechanically weaker than the silicon oxide. Therefore, minimizing CMP step in an integration process is a goal for all IC manufacturers. The topography on the wafers also causes problems for the CMP process. Specifically, the large steps such as the 0.5 micron step of the above example over the large features such as 100 micron wide trenches or bond-pads, cause dishing defects after CMP. Therefore, both in terms of cost and enabling features, it is very attractive to have processes that have the ability to yield thinner copper deposits with reduced surface topography on wafers.

During the copper electrodeposition process, specially formulated plating solutions or electrolytes are used. These electrolytes typically contain water, acid (such as sulfuric acid), ionic species of copper, chloride ions and certain additives which affect the properties and the plating behavior of the deposited material. Typical electroplating baths contain at least two of the three types of commercially available additives such as accelerators, suppressors and levelers. It should be noted that these additives are sometimes called different names. For example, the accelerator may be referred to as a brightener and the suppressor as a carrier in the literature. Functions of these additives in the electrolyte and the role of the chloride ion are widely known in the field (see for example, Z. W. Sun and G. Dixit, "Optimized bath control for void-free copper deposition", Solid State Technology, November 2001, page. 97), although the details of the mechanisms involved may not be fully understood or agreed upon.

Electrodeposition process needs to fill all the features, small and large, on the substrate. FIG. 1A schematically shows the cross sectional view of an exemplary wafer surface with high-aspect ratio vias 10, a medium aspect-ratio trench 11, and a small aspect-ratio pad 12, coated with a barrier/seed layer 13, which is shown as one layer to simplify the drawing. Vias, trenches, and pads are often known as cavities. As is well known in the field, aspect ratio is the ratio of the depth, d, of the features to their smaller lateral dimension or width, w. In our example the depth, d, may range from 0.1 microns to 2.0 microns, although deeper features may also be used for certain applications such as packaging applications. The width of the vias 10 may be sub-micron in size and their aspect ratio (d/w) may be in the range of 1–10. The trench 11 may have an aspect ratio of 0.1–1 and the pad 12 may have an aspect ratio of less than 0.1. For a feature depth of for example 0.5 microns, the vias may be 0.1 micron wide, the trench 11 may be 2 micron wide and the pad may be 20 microns wide.

FIG. 1B shows the substrate of FIG. 1A after copper deposition carried out by prior art methods. The solid line 15 indicates the typical topography of the copper film resulting from a typical ECD process employing an additive package containing two additives, accelerator and suppressor species. It is well known that these additives help bottom-up filling of the high aspect-ratio vias 10 with copper. The mechanism of bottom-up fill, however, becomes less and less effective as the aspect ratio of the features become smaller and smaller, and the deposition becomes more and more conformal. The result is shown in FIG. 1B as a small step D1 over the medium size feature or trench 11 and a large step D2 over the large feature or pad 12. It should be noted that magnitude of these steps over the various size features is at most as large as the feature depth, d. The overfill, O, shown over the dense array of vias 10 is typically observed in copper films deposited by the electrolytes containing two-component additive package of this example. As can be seen in FIG. 1B, the surface topography of the copper film is large and this presents challenges in the CMP step as described earlier.

Several developments have been provided by prior art methods to improve the copper topography depicted by the solid line 15 in FIG. 1B. To reduce or eliminate the overfill O, a third additive, leveler, is added into the electrolyte formulation. By controlling the concentration of the additive carefully, the profile of copper over the dense array of vias 10 could be made flat, which is shown as the dotted line 16 in FIG. 1B. U.S. Pat. No. 6,346,479 B1 describes a method where copper is deposited in a non-conformal electroplating process to fill a portion of the features. A second electroplating process is then performed to conformally deposit copper in the remaining unfilled portion of the openings or features. Such an approach may yield a flat profile over dense array of small features such as vias 10 of our example, as well as possibly over the medium size features such as trench 11 of our example as depicted by dotted lines 16 and 17, respectively. However, as disclosed in U.S. Pat. No. 6,346,479 B1 the second electroplating process conformally deposits copper over the substrate, and therefore can not eliminate the large step D2 over the large features such as the pad 12 shown in our example of FIG. 1B. U.S. Pat. No. 6,350,364 B1 describes a method of electroplating copper in trenches where a first copper deposition step has a first ratio of brightener-to-leveler concentration and a second copper deposition step has a second ratio of brightener-to-leveler concentration that is less than the first ratio of brightener-to-leveler concentration. This way it is reported that the step D1 of FIG. 1B can be reduced. As is well known in the field copper electroplating additives are not operative in the very large features with very small aspect-ratios such as the pad 12 of FIG. 1B. Therefore, the step D2 is not expected to be much reduced or eliminated by such approaches. D2 only gets reduced and eliminated if a very thick copper layer with thickness value close to half the width of the largest feature on the wafer is plated (see e.g. U.S. Pat. No. 5,256,565, Oct. 26, 1993). However, this is not practical considering the fact that many interconnect designs involve feature sizes well above 10 microns.

As the above review demonstrates, some of the prior art techniques aiming to obtain relatively flat copper topography on patterned wafer surfaces may be applicable for the class of wafers with large or medium aspect-ratio features. However, many IC interconnect designs contain features with a wide variety of aspect ratios on a given wafer surface. Especially in multi-level interconnect structures the width of the high-current-carrying lines increase while their aspect-ratios decrease at the higher wiring levels. Therefore, an approach that has the capability of reducing or eliminating surface topography of copper over features with a large range of aspect ratios is needed.

A technique that can reduce or totally eliminate copper surface topography for all feature sizes is the Electrochemical Mechanical Processing (ECMPR). This technique has the ability to eliminate steps D1, D2 and overfill O shown in the example of FIG. 1B, and provide thin layers of planar conductive material on the workpiece surface, or even provide a workpiece surface with no or little excess conductive material. This way, CMP process can be minimized or even eliminated. The term "Electrochemical Mechanical Processing (ECMPR)" is used to include both Electrochemical Mechanical Deposition (ECMD) processes as well as Electrochemical Mechanical Etching (ECME), which is also called Electrochemical Mechanical Polishing (ECMP). It should be noted that in general both ECMD and ECME processes are referred to as electrochemical mechanical processing (ECMPR) since both involve electrochemical processes and mechanical action on the workpiece surface. An exemplary flat copper surface profile resulting from an ECMPR is shown as the flat dotted line, 18, in FIG. 1B.

Descriptions of various ECMPR approaches and apparatus, can be found in the following patents, published applications and pending applications, all commonly owned by the assignee of the present invention: U.S. Pat. No. 6,126,992 entitled "Method and Apparatus for Electrochemical Mechanical Deposition," U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2001 and published as U.S. patent application on Feb. 21, 2002 with patent application No. 20020020628, U.S. application filed on Sep. 20, 2001 with Ser. No. 09/961,193 entitled "Plating Method and Apparatus for Controlling Deposition on Predetermined Portions of a Workpiece", U.S. Application with Ser. No. 09/960,236 filed on Sep. 20, 2001, entitled "Mask Plate Design", and U.S. application Ser. No. 10/155,828 filed on May 23, 2002 entitled "Low Force Electrochemical Mechanical Processing Method and Apparatus." These methods can deposit metals in and over cavity sections on a workpiece in a planar manner.

SUMMARY

The present invention relates to a process for forming a near-planar or planar layer of a conducting material, such as copper, on a surface of a workpiece using ECD and ECMPR techniques. The process preferably uses at least two separate plating solution chemistries to form a near-planar or planar copper layer on a semiconductor substrate that has features or cavities on its surface.

In one aspect, the present invention provides a process for forming conductive structures on a semiconductor wafer having a top surface with first and second cavities formed in the top surface. The first cavity of the wafer has a narrower width than the second cavity.

The process includes the step of depositing a first conductive layer by employing an electrochemical deposition process. The deposition process uses a first electrolyte solution having a first additive composition. The conductive layer completely fills the cavities while forming a planar surface over the first cavity and a non-planar surface over the second cavity.

The process further includes the step of depositing a second conductive layer on the first conductive layer to form a planar conductive layer over the first and second cavities. The planar conductive layer comprises the first and the second conductive layers and the second conductive layer is deposited using an electrochemical mechanical deposition process using a second electrolyte solution having a second additive composition.

BRIEF DESCRIPTION OF THE DRAWINGS

The above and other features and advantages of the invention are further described in the detailed description which follows, with reference to the drawings by way of non-limiting exemplary embodiments of the invention, wherein like reference numerals represent similar parts of the invention throughout several views and wherein.

DETAILED DESCRIPTION

Figure 2:
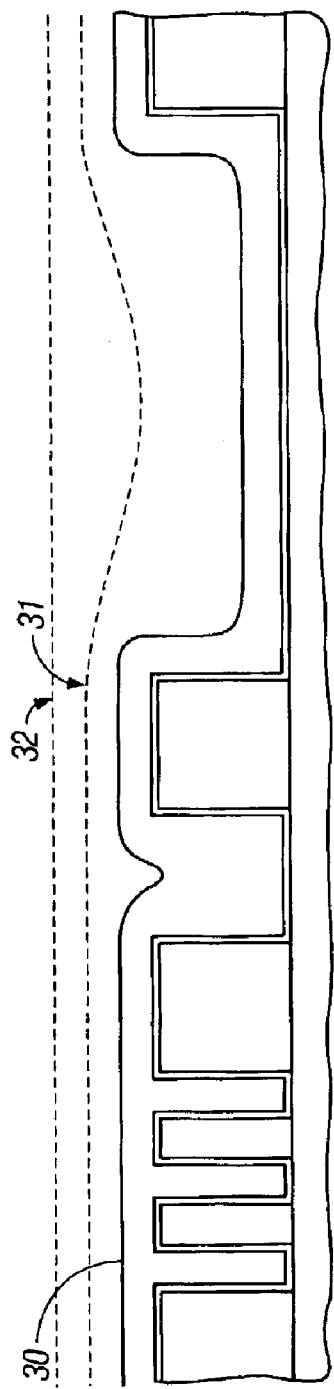
FIG. 2 illustrates a cross sectional view of the exemplary wafer of FIG. 1A that has had a conductor applied thereover using methods according to the present invention.

The process of the present invention relates to a process for forming a near-planar or planar layer of a conducting material, such as copper, on a surface of a workpiece using an ECMPR technique such as ECMD. The process of the present invention preferably uses at least two separate plating solution chemistries to form a near-planar or planar copper layer on a semiconductor substrate that has features or cavities on its surface. The unique feature of the present invention is the fact that it can be applied to substrates with features or cavities of a wide variety shapes and dimensions. For example the substrate may have high-aspect ratio small size features, such as sub-micron size vias or trenches, as well as very low aspect-ratio features such as larger than 10 micron wide trenches and larger than 20 micron size pads or channels. There may even be larger than 500 micron features on this exemplary wafer. At a first stage of the present invention, a plating process that is optimized for the defect-free filling of the small features is carried out. During this stage, plating is done in non-touch mode with no mechanical sweeping on the wafer surface. The no-touch process uses a first plating solution with first additive chemistry that is optimized for the best gap-fill performance. This chemistry may contain accelerators and suppressors and optionally levelers. At this stage the small and mid size features are entirely filled with copper while the larger size features are partially or completely conformally coated with a copper layer. An example of a copper layer profile resulting from the first stage of the present invention is shown in FIG. 2 as profile 30. It should be noted that all the small features are filled with copper. There is a small step over the medium size feature and a large step over the large feature. This first stage of the present invention may be continued until the copper level over the largest feature becomes substantially the same as the level of the top surface of the insulating layer. In this case, the smaller step may be reduced but the step over the large features stays substantially the same.

Figure 1A:
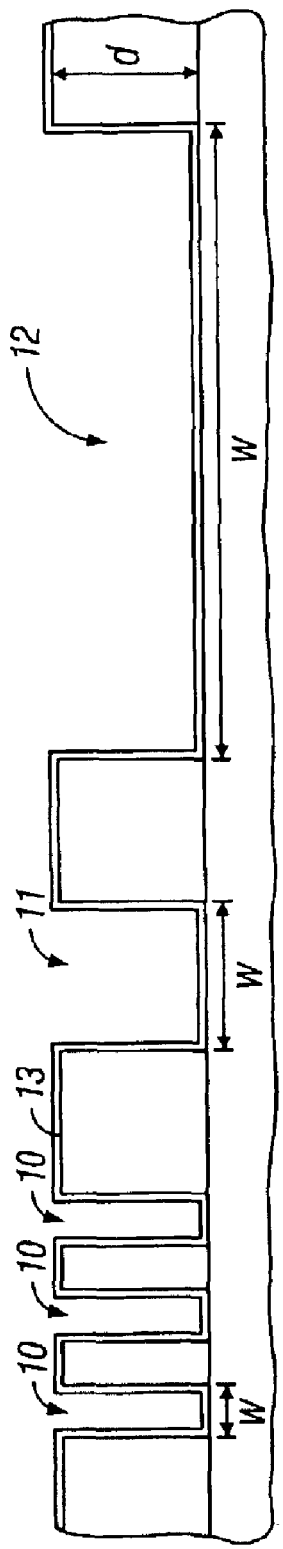
FIG. 1A illustrates a cross sectional view of an exemplary wafer that requires application of a conductor thereover.
Figure 1B:
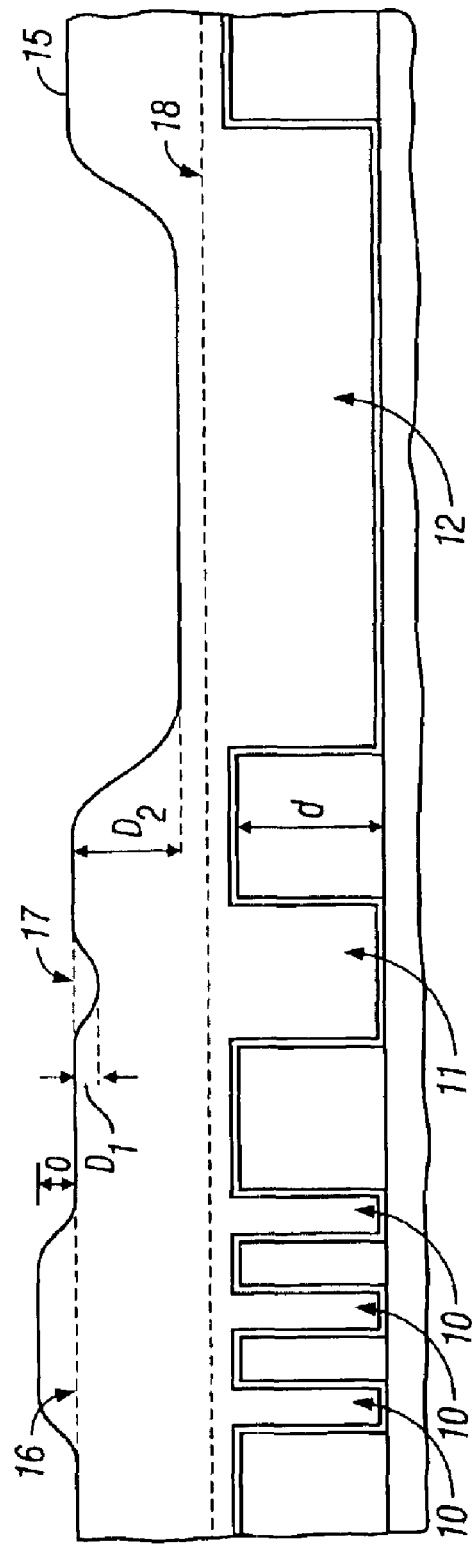
FIG. 1B illustrates a cross sectional view of the exemplary wafer of FIG. 1A that has had a conductor applied thereover using conventional methods.

A second stage of the present invention uses an ECMPR touch-process, typically including at least an ECMD process, with a second plating solution that has a second additive chemistry, which is optimized specifically for this planar deposition or planarization step. This second chemistry, for example, may contain only one or two of the three additives that may be used for the first stage. Depending upon the duration of the touch-step a copper profile that is substantially flat (shown as profile 31) or absolutely flat (shown as profile 32) can be obtained. As the duration of the touch-step is increased the surface becomes flatter and flatter. In any case the reduced, flatter topographies of profiles 31 and 32 in FIG. 2 as compared the prior-art large topographies of FIG. 1B, increase the efficiency of the CMP process and reduce CMP related defects such as dishing and erosion.

Figure 3:
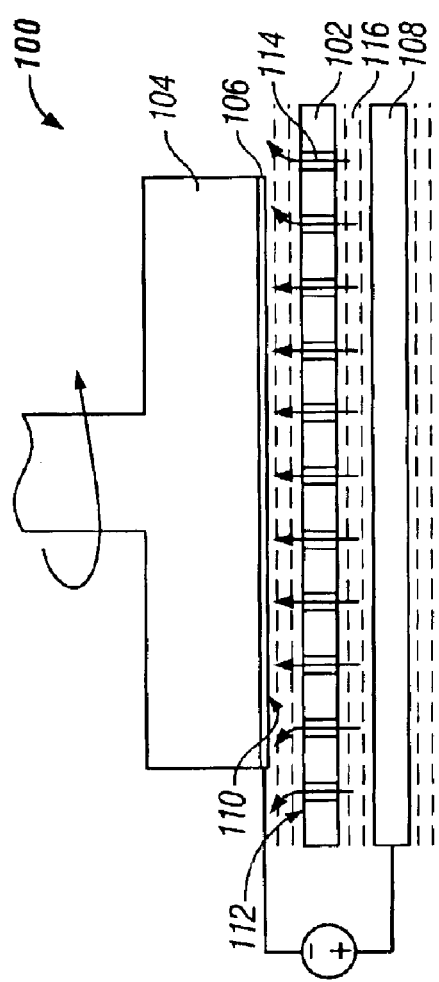
FIG. 3 illustrates a portion of an exemplary ECMPR system that can be used to practice the present invention.

FIG. 3 shows an exemplary ECMPR system 100 that can be used to practice the present invention. The ECMPR system includes a workpiece-surface-influencing device (WSID) 102 such as a mask, pad or a sweeper, a carrier head 104 holding a workpiece 106 such as a wafer, and an electrode 108. The wafer can be a silicon wafer to be plated with copper using the ECMD process. The WSID 102 is used during at least a portion of the ECMD when there is physical contact and relative motion between a front surface 110 of the wafer 106 and the top surface 112 of the WSID 102. During ECMD, the top surface 112 of the WSID 102 sweeps the surface 110 of the wafer 106 while an electrical potential is established between the electrode 108 and the surface of the wafer. Alternately, in some cases potential is established right after WSID 102 surface 112 sweeps the surface 110 of the wafer. In other words establishment of the potential and sweeping of the substrate surface by the WSID 102 do not have to be simultaneous or continuous as described in detail in previous applications cited above. Channels 114 of the WSID 102 allow a process solution 116 such as a copper plating electrolyte to flow to the surface of the wafer 106.

Figure 4A:
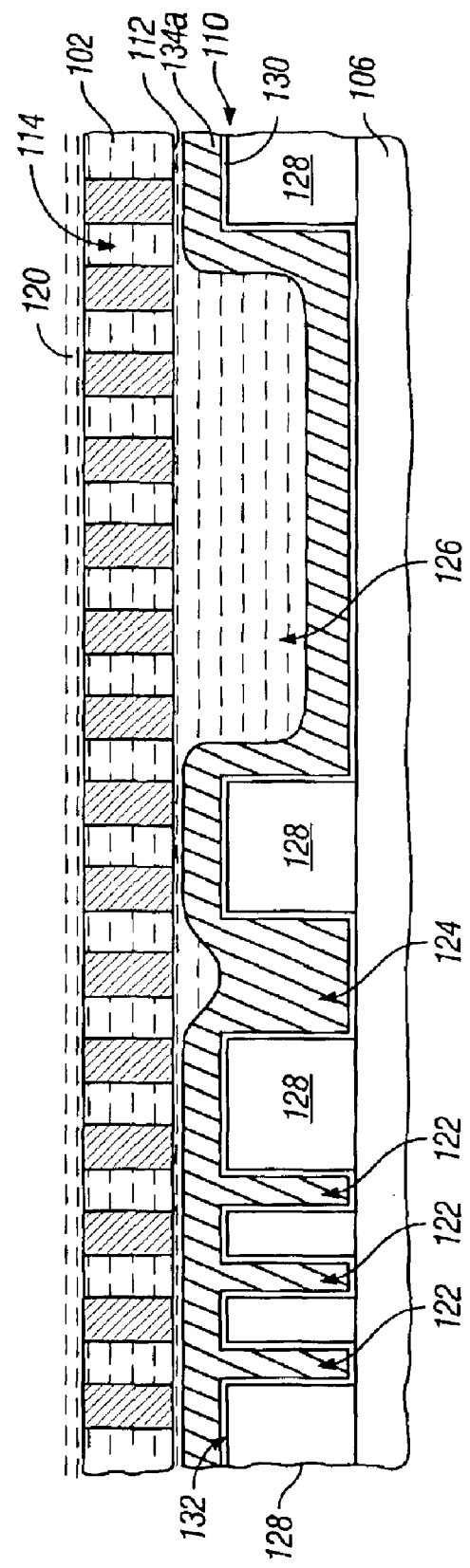
FIGS. 4A–4C illustrate profiles of an exemplary wafer at different stages of the process according to the present invention.

FIG. 4A shows the front surface 110 of the wafer 106 as it is electroplated using a first electroplating solution 120. The surface 110 may include small features 122, a mid size feature 124 and a large feature 126. The small size features may have a width less than a micron while the mid size features may have 1 to 5 micron width range. Large features may have a width larger than 10 microns. The features 122, 124, 126 are formed in an insulating layer 128 that is formed on the semiconductor wafer 106. A barrier layer 130 such as Ta, TaN or their composite Ta/TaN coats the inside of the features and the top surface 132 of the insulating layer 128. The top surface 132 is also called the "field region." A seed layer (not shown) such as a thin copper layer is coated on the barrier layer. During the process, the wafer 106 is placed away from the WSID (no-touch plating) and the first electroplating solution is flowed through the WSID to wet the front surface 110 of the wafer 106 while the wafer is rotated and moved laterally. Once an electrical potential is applied between the wafer and the electrode, i.e., anode, (shown in FIG. 2), a first copper layer 134a is formed. The first copper layer 134a fills the small and mid size features in bottom-up fashion but conformally coats the large feature because of its large width.

In the first stage of the process, the WSID acts as a shaping plate. It is important that the channels of the WSID not only allow the process solution to flow to the surface of the wafer, but also shapes the plating current density and thus the resulting thickness profile of the deposited copper layer. The distribution, shape and size of the openings may introduce regions of low, intermediate, and high deposition rates above the WSID. By moving the wafer over these regions during the process a desired thickness profile, e.g., a uniform thickness profile, of the depositing layer is obtained. An exemplary process of thickness profile control is disclosed in U.S. patent application Ser. No. 09/760,757 filed on Jan. 17, 2001, entitled "Method and Apparatus for Electrodeposition of Uniform Film on Substrate" which is commonly owned by the assignee of the present invention. If desired, this plating step can be carried out without the WSID if other means are provided to yield a uniform deposit.

In this embodiment, the first electroplating solution 120 may comprise at least two additives to enhance bottom up filling of the small features without any voids, seams and other defects. For example a high-acid plating electrolyte containing 0.8–2 ml/l of Cubath® ViaForm™ Accelerator available from Enthone-OMI®), West Haven, Conn. and 6–12 ml/l of Cubath® ViaForm™ Suppressor marketed by the same company may be used in the basic plating bath chemistry which contains sulfuric acid, copper sulfate, water and chloride ions. Low acid versions of the plating chemistry may require quite different concentrations of accelerators and suppressors (such as an accelerator concentration of about 4–8 ml/l, and suppressor concentration of 2–4 ml/l for the case of Enthone low acid chemistry). During the process, the accelerators allow bottom up growth of copper in the small features that are filled quickly. The suppressor molecules which are adsorbed at the top of the openings of the small features slow down the copper growth therein, thus avoiding both premature closing of these passages and formation of voids. In addition to the accelerator and suppressor species, levelers may also be added in the formulation to reduce or eliminate the over-fill phenomenon discussed before in this application. Levelers get adsorbed preferentially on high-current density regions of the plated surface and help reduce this current density and thus protrusions that would have resulted. A leveler concentration of 0.5–2 ml/l may be used for this purpose in addition to the accelerator and suppressor species in the exemplary high acid chemistry mentioned above. An exemplary leveler which is sold under the brand name Cubath® ViaForm™ Leveler is available from Enthone-OMI®.

Figure 4B:
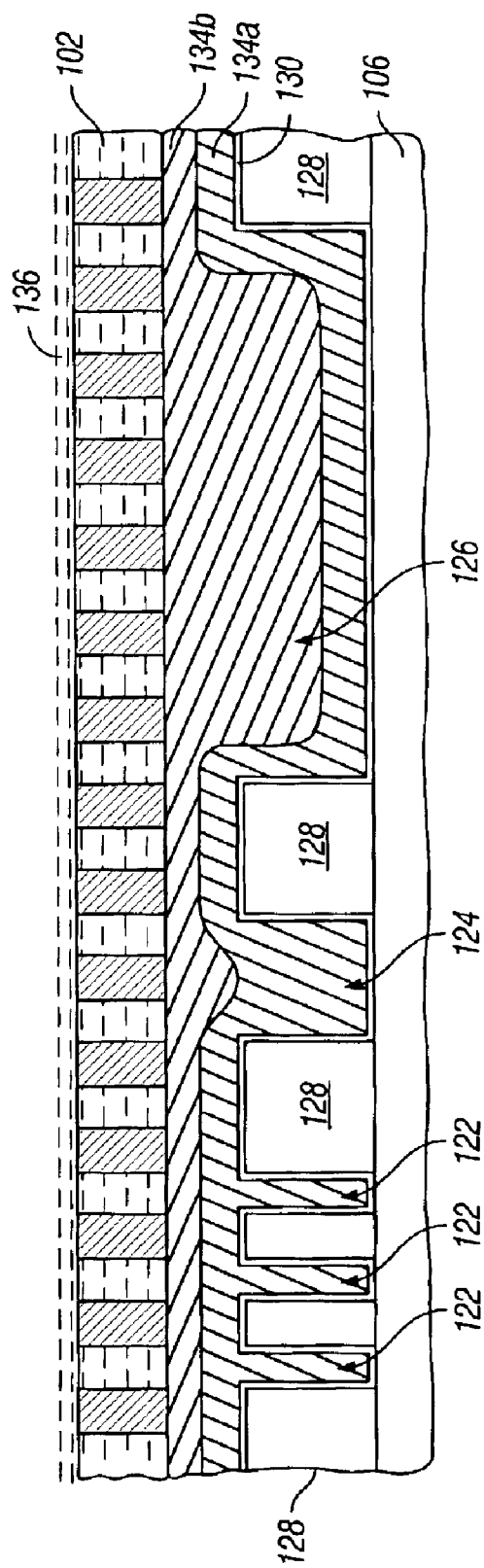
Figure 4C:
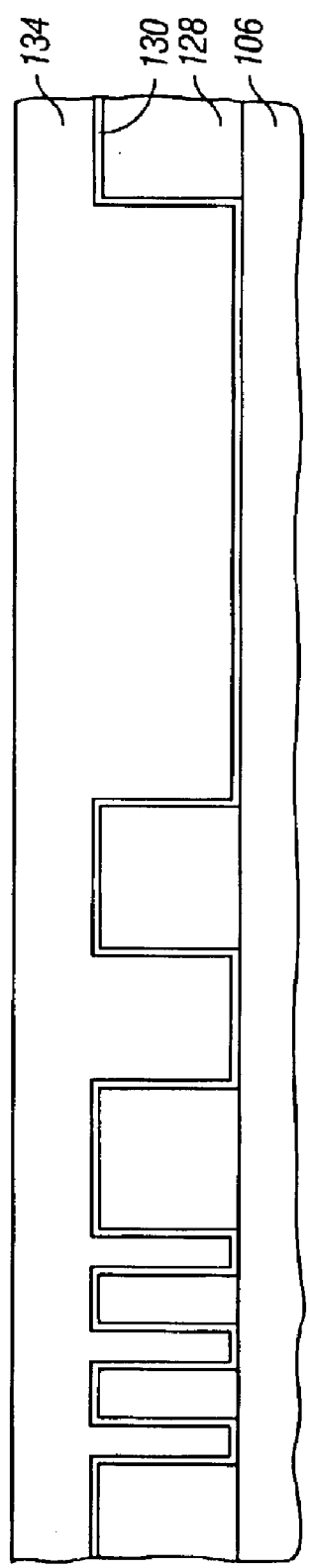
Figure 5A:
FIGS. 5A and 5B illustrate focused ion beam images of a wafer processed in various manners according to the present invention.
Figure 5B:
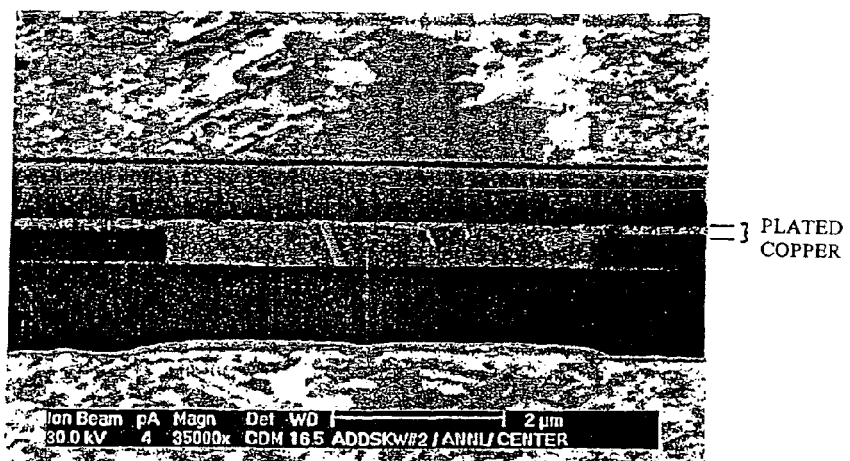

As illustrated in FIG. 4B, once the no-touch plating with the first plating solution is completed, an ECMD touch-plating stage using a second plating solution 136 forms a second layer 134b that coats the first copper layer in a non-conformal fashion, depositing more materials into the cavities and less onto the surface regions where WSID sweeps. During this touch-plating process, as the second plating solution 136 is delivered onto the first copper layer 134a, WSID touches and mechanically sweeps the part of the first layer 134a that is located on the field regions and over the small and mid size features. Combined with the chemistry of the second plating solution, the sweeping action of the WSID slows down the growth of the copper layer on the field region and above the small features which are already filled and accelerates growth of the copper layer in the large features, thus planarizes the overall Copper deposit. It should be noted that the touch-plating stage of the process may be terminated before total planarization is achieved if the degree of planarization achieved at that point is adequate for simplifying the overburden removal process such as a CMP process, which follows the deposition process. In this embodiment, the additive chemistry of the second plating solution is optimized for the touch-plating step. For example, the second plating solution 132 may not contain any levelers. Furthermore, the accelerator-to-suppressor ratio in the second electrolyte may be higher than the ratio in the first electrolyte. Referring back to the exemplary high acid electrolyte mentioned above the accelerator concentration in the second electrolyte may be in the range of 2–10 ml/l, whereas the suppressor concentration may be in the 2–8 ml/l. This can be done because all the small features have already been filled on the wafer by the first plating step and therefore there is no danger of causing void formation in such features by these new additive concentrations, which if used during the first stage process would result in non-optimal filling of the small features. The second electrolyte may even contain a single additive which is an accelerator. The present inventors observed that although single additive baths containing only suppressors or only accelerators could be used for planarization in an ECMD process, planarization was more efficient for the baths containing just accelerators compared to baths containing just suppressors. FIG. 5A shows the Focused Ion Beam (FIB) image of a 5-micron wide trench on a wafer which was coated with copper using an ECMD apparatus and a copper sulfate electrolyte comprising Enthone Via-Form high acid VMS solution and 8 ml/l of Cubath® ViaForm™ Leveler. A charge of 4 A-min was passed between the 200 mm diameter substrate and a copper anode during this process and a WSID was in contact with the wafer which was rotated at 50 rpm. As can be seen from the image in FIG. 5A there is relatively more copper deposited into the feature than onto the top surface of the substrate indicating partial planarization. FIG. 5B shows the FIB cross-section taken from the same location of a similar wafer, which was processed similarly, however this time in another copper sulfate electrolyte comprising Enthone Via-Form high acid VMS solution and 2.2 ml/l of Cubath® ViaForm™ Accelerator. It is clear that copper deposition rate into the feature is higher in this case than the case in FIG. 5A indicating better planarization efficiency. In FIG. 5B, the copper film in the 5 micron trench is completely planar. This example illustrates that the solution chemistry may be optimized for best planarization of a substrate during the touch-plating stage of the present invention.

The present invention allows optimization of the chemistry for the first stage of the process separate from the optimization of the chemistry for stage 2. This is important because although it is possible to use the same chemistry for both the first and second stage of the ECMPR as described in the above mentioned patents and patent applications, it is attractive and beneficial to have the ability to optimize chemistry for the two stages independent from each other as will be further described below.

Concentrations and types of additives used in the first stage of the subject process may vary depending upon the nature of the additives, nature of the small features, nature of the barrier/seed layers, etc. For example, some accelerator species containing sulfur react with weak seed layers. If the seed layer is very thin on the side-walls of the vias for a specific wafer, it may be necessary to reduce the accelerator-to-suppressor ratio in the electrolyte in the first stage of the process that is employed to coat this specific wafer. For other wafers with other types of seed layers it may be necessary to further adjust the relative concentrations of additives to obtain the best gap fill performance. If the over-fill over the dense array of small features presents a problem, it may be necessary to include leveler into the formulation in addition to the accelerator and suppressors.

The electrolyte chemistry, which is adjusted for best gap fill in the first stage may not be the best for the second stage of the process when planarization takes place. For example, levelers are known to get attracted to high current density regions on the wafer surface. However, ECMD process is known to accelerate growth in cavities on the substrate surface by increasing the deposition current density in such cavities compared to the top surface of the wafer swept by the WSID. Therefore, levelers in an electrolyte used for the second stage of the process may lower the planarization efficiency. This is an example of how presence of an additive (such as a leveler) in the process electrolyte may be favored during the first stage (no-touch step) of the process, whereas its presence may not be necessary or desired during the second stage (touch plating step). Similarly, a higher accelerator-to-suppressor ratio may be desirable in the second stage than for the first stage of the process as described before. The experiment of FIG. 5B indicated that an electrolyte containing only accelerator species may be successfully used in the second stage of the process, although such a formulation may not be successfully used for the first stage. Use of only one additive for the second process step may reduce the total additive consumption, simplify additive measurement and control systems, reduce costs and improve planarization efficiency increasing throughput. Total impurity content of the deposited film may also be reduced by this approach.

In accordance with the principles of the present invention the first and the second stages of the process may be either performed in the same process module or multiple process modules. If the same process module approach is used to perform both stages, the first and second stages are performed sequentially, and using a first solution for the first stage and a second solution for the second stage. As fully described above, the first solution chemistry includes additives enhancing bottom up filling of the features on the wafer. And, the second solution chemistry includes only one or two of the three additives that may be used for the first stage and is optimized specifically to obtain a planar copper layer. If there are multiple process modules, the first stage may be carried out in a first or first group of process modules with the first solution chemistry, and the second stage may be carried out with a second or second group of process modules using the second solution chemistry. Following the two-stage deposition, the wafer is cleaned and planar or near-planar copper overburden is removed using the CMP or other (e.g., electropolishing) removal methods. The copper overburden may be removed before or after an annealing step.

It should be noted that after the second stage of the present process, optionally a third and even a fourth step can be used to reduce the thickness of the copper overburden. After the second stage of the process, the copper removal process may be performed as a third stage of the process that employs either an electrochemical etching or polishing stage or an ECME (electrochemical mechanical etching or polishing) stage. The removal process may be also performed using both steps sequentially as a third and fourth stage, for example, a no-touch electroetching step that is followed by a touch ECME, or a touch ECME followed by a no-touch electroetching. Thin planar deposits can be obtained by first depositing a planar layer using the ECMD technique at the first and second stages, and then electroetching or electropolishing this planar film in the same electrolyte or in an electroetching solution by reversing the applied voltage. This way the thickness of the deposit may also be reduced in a planar manner. In fact, etching may be continued until all the metal on the field regions is removed. These techniques may be performed subsequent to second stage and using the second solution as an electroetching solution while reversing the polarity of the applied voltage and rendering the workpiece surface more anodic compared to the electrode. Alternatively, a third solution comprising an electroetching solution may replace the second solution at the third stage and a fourth stage of the process, for example a no-touch electroetching (third stage) followed by a touch ECME (fourth stage). In this respect, a fourth stage such as a touch ECME process stage may be performed using a fourth solution.

Figure 6:
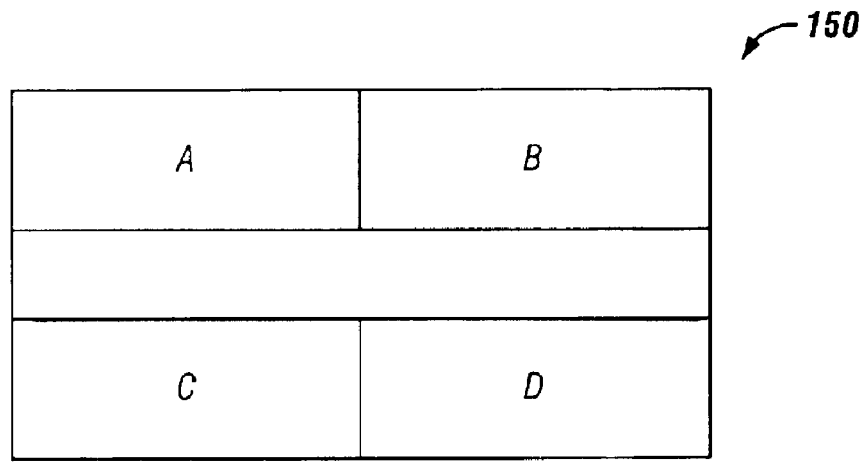
FIG. 6 illustrates a system of modules that can be used to implement the process according to the present invention.
Figure 7:
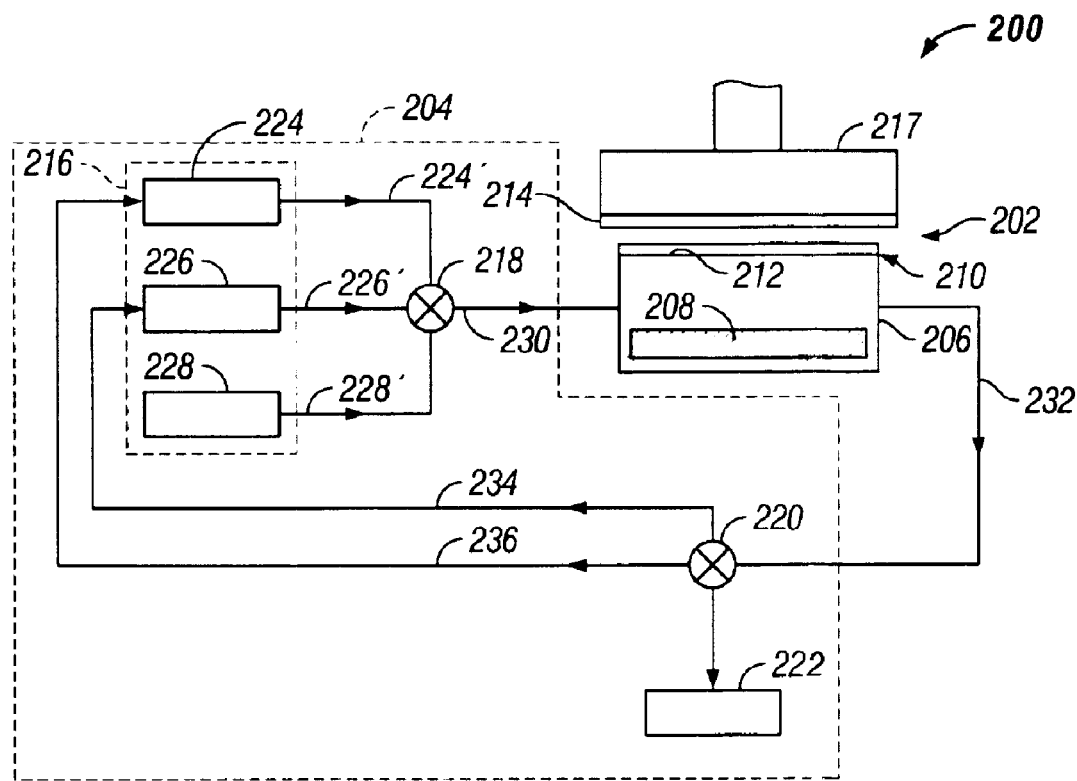
FIG. 7 illustrates a process supply system for use with a single process module according to the present invention.

FIG. 6 exemplifies a system 150 using multiple modules A, B, C and D. In this exemplary configuration, the modules A and B may be ECD or ECMD modules to perform the first stage of the process with a first process solution. The second stage of the process may be performed in module C, which may also be an ECMD module, using the second process solution. Module D may be an ECME module to perform the above described third stage, such as a no-touch electroetching or ECME using the second process solution or third process solution, or to perform a fourth electroetching stage, such as a touch ECME, that uses the process solution that is used for the third stage or a fourth process solution such as an electroetching solution. Alternately the modules A, B, C and D may be ECD and ECMD modules carrying out the first and second stages of the process using two different solutions as explained before. Number of each different module will depend on the throughput of the first and the second stage processes. A robot would be used to transfer wafers between the various modules. FIG. 7 exemplifies a preferred system 200 using the single process module approach as applied to a two-step process.

As shown in FIG. 7, the system 200 comprising a first process module (PM1) 202 and a first process solution module (PSM1) 204. PM1 includes a process container 206 to hold process solutions and an electrode (anode) 208. The process container may have a volume less than two liters, preferably less than one liter. An upper opening 210 of the process container is enclosed with a WSID 212. Above the WSID 212, a wafer 214 to be processed by the process of the present invention is held by a wafer carrier 217. The PSM1 comprises a process solution supply unit 216, a first valve 218, a second valve 220 and a drain 222. The supply unit 216 supplies fresh process solutions to the process container via the first valve 218. The used solutions from the process container 206 is delivered back to the supply unit or to the drain 222 via the second valve 220.

Referring to FIG. 7, the process supply unit 216 comprises a first tank 224 to store the first solution for the first stage of the process, a second tank 226 to store the second solution for the second stage of the process. Descriptions of the first solution, second solution, first stage and second stage are given in the above description. When the used solutions are received by the unit 216, their additive and plating solution chemistries are checked and then replenished so that the tanks 224, 226 always keep process solutions with the right chemistries. The supply unit 216 also includes a rinse tank 228 to store DI water. DI water is used to clean the process container 206 before the beginning of each process stage to. DI water may come directly from a DI line rather than from a tank. The tanks 224, 226 and 228 are connected to the valve 218 through supply lines 224', 226' and 228'. The valve 218 is connected to the process container 206 through a line 230. Further, used solutions (first, second and the rinsing solutions) are brought to the valve 220 through the line 232. From the valve 220, the first solution is taken to first tank via line 234, the second solution is taken to second tank via line 236. The rinsing solution from the valve 220 is directed to the drain 222.

In an exemplary process sequence, at the first stage of the process, the first process solution from the first solution tank 224 of the PSM1 is delivered, via the valve 218, to the process solution container 206 of the PM1 and circulated back through return line 236. After the wafer 214 is processed the valve 218 is turned to DI supply and DI water from the rinse tank 228 is delivered to the process container 206 via the valve 218 to clean the process container from the residues of the first solution. During the cleaning, the valve 218 may be periodically turned off and the valve 220 is turned on to direct the used rinsing solution to the drain 222.

Figure 8A:
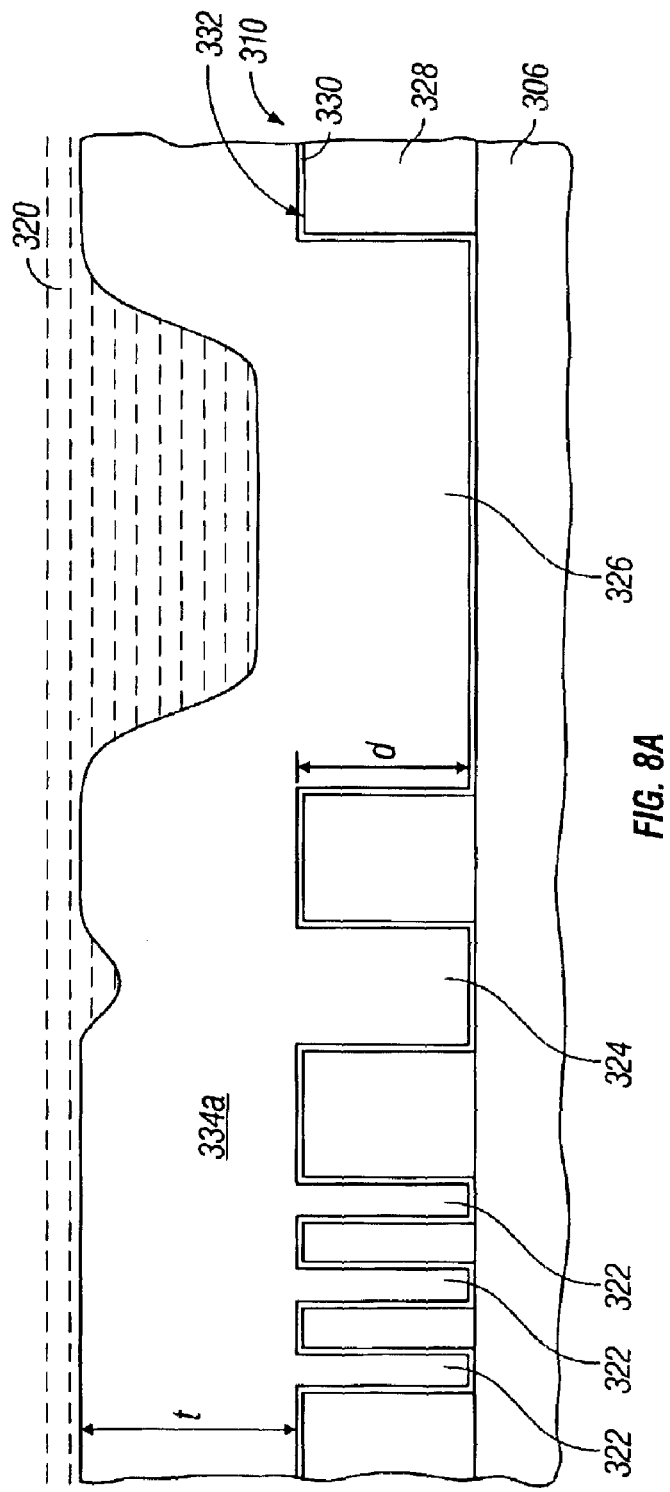
FIG. 8A illustrates a cross sectional view of a wafer surface processed according a to a second embodiment of the process, wherein a conductor layer has filled the features on the wafer and formed a non-planar layer on the wafer surface.
Figure 8B:
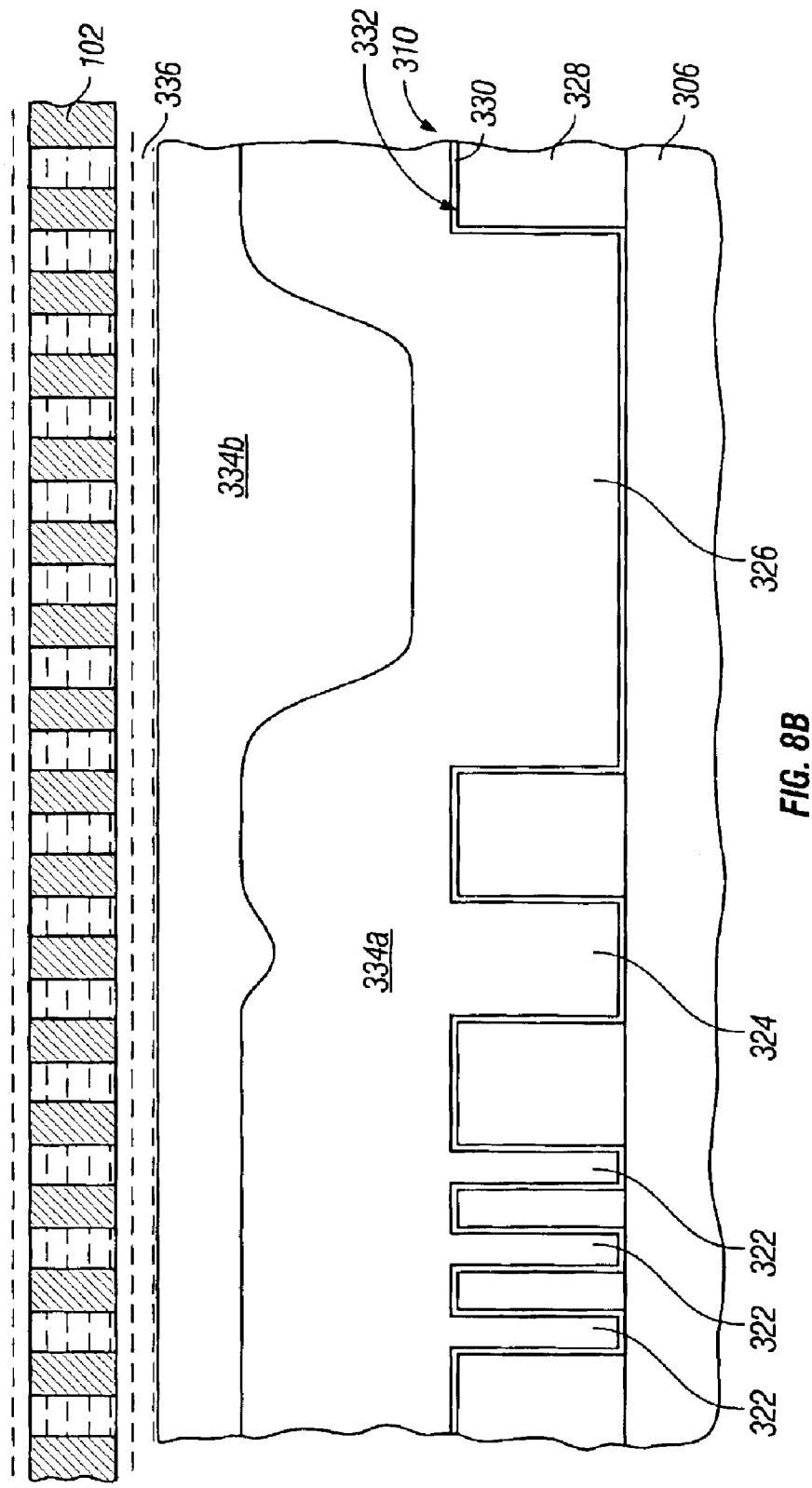
FIG. 8B illustrate the wafer surface shown in FIG. 8A, wherein a planar conductor layer has been formed on the wafer surface.
Figure 8C:
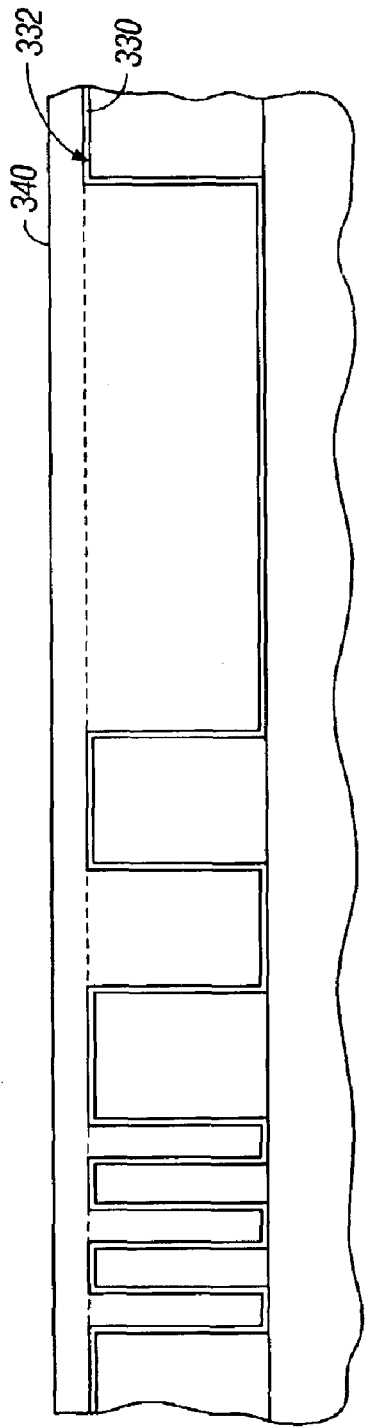
FIG. 8C illustrate the wafer surface shown in FIG. 8B, wherein the planar conductive layer has been electropolished.

After the rinsing the second stage of the process is performed similar to the first stage but using the fresh second solution from the second tank 226 and delivering the used second solution back to second solution tank 226 for the replenishment and storage purposes. After the second stage of the process, the process container is once again rinsed for the following wafer to be processed with the process of the present invention. It should be noted that there are many ways of feeding the various solutions to the process module. The example given here is just one of many possibilities. In case the two solutions used in this example are compatible, the rinse steps in between may be skipped and small amount of intermixing between the solutions may be allowed FIGS. 8A–8C show a second embodiment of the present invention. In the second embodiment, at a first stage, all of the features are filled with copper until the copper level within the largest feature reaches, at least, the level of the top surface of the insulating layer. During this stage, plating is done in no-touch (electrochemical deposition or ECD) mode with no mechanical sweeping on the wafer surface. This stage may be performed using an electrochemical deposition system and process. However, an ECMPR system utilizing no-touch process may also be used. The process uses a first plating solution with first additive chemistry that is optimized for the best gap-fill performance and the best quality copper. This chemistry may contain accelerators, suppressors and optionally levelers. With this approach, a plating process that is optimized for the defect-free filling of the small features as well as large features is carried out so that the small, mid size and large features are entirely filled with good quality copper to at least the level of the top surface of the insulating layer. An example of a copper layer profile resulting from the first stage of the present invention is shown in FIG. 8A. It should be noted that once all the features are filled with copper, there is a small step over the medium size feature and a larger step over the large feature. These steps are then eliminated by the deposition of a planar sacrificial layer in the following planarization step.

A second stage of the process is a planarization stage and uses an ECMPR touch-process, typically including an ECMD process, with a second plating solution that has a second additive chemistry, which is optimized specifically for this planar deposition or planarization step. The second stage of this embodiment may be performed either in the same process module that the first stage is performed or in a different process module. If it is performed in the same ECMPR system, the first plating solution may be replaced with the second solution. Further, the second stage of the process can be performed in a different ECMPR system using the second solution. With the touch process, deposited copper fills the steps on the copper layer formed at the first stage, and forms a planar layer. Since the copper deposited at the first stage has already filled the features, the copper deposited in the second stage is for forming a planar copper layer on the surface i.e. planarizing the wafer surface. The second chemistry used in this planarization stage may contain only one or two of the three additives that may be used for the first stage. The copper quality resulting from the second chemistry may not be as good as the quality of the copper from the first chemistry using three components. This may be acceptable since the copper deposited in the second step is sacrificial and will be removed later.

It should be noted that there may be an optional annealing step between the first and second stage of the present process. In other words, since the first step fills all the features with good quality copper, the resulting film depicted in FIG. 8A may be annealed to grow and stabilize the grain structure of this film before continuing with the second step to obtain a planar layer.

As a result of the second step and depending upon the duration, a copper profile that is substantially flat can be obtained. As described in the previous embodiments, as the duration of the touch-step is increased the surface becomes flatter.

Flatter topography provided by the second stage of the process increases the efficiency of the following third stage or the material removal stage using for example an electropolishing or electroetching stage. The electropolishing or electroetching may be performed in the same ECMPR system by reversing the polarities between the substrate and the electrode. The second solution used in the previous planarization stage may be used as the etching solution under the reversed polarity conditions. However, the second solution may also be replaced with a specially formulated etching solution to perform the electropolishing process. Alternatively, the electropolishing process may be performed in a separate electropolishing module using a separate etching solution. This alternative electropolishing system may be an electrochemical mechanical etching or polishing module or an electrochemical polishing module that does not introduce mechanical action on the wafer surface during the electropolishing process. It should be noted that throughout this application electrochemical etching or electrochemical polishing refer to the same process of removing material by electrochemical means. Similarly electrochemical mechanical etching (ECME) and electrochemical mechanical polishing (ECMP) refer to the same group of processes.

When applied to the plated substrate, the electropolishing process may entirely remove the copper layer deposited during the planarization step using the second chemistry while partially removing the copper layer deposited during the ECD step using the first chemistry. The partially removed part of the copper deposited with first chemistry is the copper portion that is outside the features. Although in this embodiment, the step following the second stage of the process is an electropolishing process, a CMP process can also be used to remove the planar layer and is within the scope of this invention. As used herein, features include cavities, vias, trenches, and pads.

Referring now to FIG. 8A, the front surface 310 of the wafer 306 is electroplated using a first electroplating solution 320. The surface 310 includes small features 322, a mid size feature 324 and a large feature 326. As in the previous embodiments, the small size features 322 may have a width less than a micron while the mid size features may have 1 to 5 micron width range. Large features may have a width larger than 10 microns. The features 322, 324, 326 are formed in an insulating layer 328 that is formed on the semiconductor wafer 306. A barrier layer 330 may be used to coat the inside of the features and the top surface 332 or field region of the insulating layer 328. However, it is understood that, in some technologies, a barrier layer is not used and such technologies are also within the scope of this invention. Conventionally, a seed layer (not shown) such as a thin copper layer may be coated on the barrier layer. During the process, if the process is performed in an ECMPR module the wafer 306 is placed away from a WSID (no-touch plating) and the first electroplating solution is flowed through the WSID to wet the front surface 310 of the wafer 306 while the wafer is rotated and moved laterally. Alternatively, if the process is performed in an ECD chamber the first electroplating solution is directly flowed against the front surface 310. Once an electrical potential applied between the wafer and the electrode, i.e., anode, (shown in FIG. 2), a first copper layer 334a or a primary copper is formed. Referring to FIG. 8A, differing from the previous embodiments, the primary copper 334a fills the small, mid size and large features, i.e. even the large feature is filled with copper at least to the level of the top surface of the insulating layer. In the previous embodiments, the first copper layer conformally coats the large feature and not necessarily fill it completely, although it fills the small and mid-size features in a bottom up fashion.

In this embodiment, the first electroplating solution 320 may comprise at least two additives to enhance filling of the all size features without any voids, seams and other defects. The chemistry of the solution 320 forms a flat film on the small or mid size features. When the flat film thickness 't' gets larger than approximately the depth 'd' of the large feature, the first stage of the plating process is halted. The t≧d condition indicates that the thickness of the copper layer within the large feature is also larger than about "d" and thus the large feature is completely filled with copper. The primary copper is a good quality copper that would, after annealing and other post-deposition procedures, provide good stress migration and electromigration properties. For example a high acid plating electrolyte containing 1.5 ml/l of Cubath® ViaForm™ Accelerator, 8 ml/l of Cubath® ViaForm™ Suppressor and 2 ml/l Cubath® ViaForm™ Leveler, all available from Enthone-OMI®, West Haven, Conn., may be used in the first solution chemistry which contains sulfuric acid, copper sulfate, water, and chloride ions. During the process, the accelerators allow bottom up growth of copper in the small features that are filled quickly. The suppressor molecules which are adsorbed at the top of the openings of the small features slow down the copper growth therein, thus avoiding both premature closing of these passages and formation of voids. Levelers reduce or eliminate the over-fill phenomenon and are adsorbed preferentially on high-current density regions of the plated surface and help reduce this current density and thus minimize the protrusions or bumps that would have resulted. It should be noted that two-component chemistries without levelers may also be used for this process as long as a near-uniform thickness of copper is obtained over the small and medium size features, without excessive bumping or overfill.

As illustrated in FIG. 8B, once the plating with the first plating solution is completed, an ECMD touch-plating stage using a second plating solution 336 forms a second layer 334b or a sacrificial copper that coats the primary copper 334a in a planar fashion, depositing more materials into the steps or cavities on the mid-size and large features and less onto the surface regions where the WSID 102 sweeps. During this planarization stage using the touch-plating process, as the second plating solution 336 is delivered onto the primary copper 334a, WSID touches and mechanically sweeps the part of the first layer 334a that is located on the field regions and over the small and mid size features. Combined with the chemistry of the second plating solution 336, the sweeping action of the WSID 102 slows down the growth of the copper layer 334b on the field region and above the small features which are already filled and accelerates growth of the copper layer in the large features, thus planarizes the overall copper deposit. The sacrificial copper is to produce a planar copper surface for the following material removal process. During the material removal step or steps, sacrificial copper is entirely removed.

The second plating solution 336 preferably does not contain any levelers although it may contain some small amount (such as 0.5 ml/l) and it may employ one component chemistry such as a chemistry containing only an accelerator, or two component chemistry such as one containing accelerator and suppressor. If the second solution is an one-component solution, the accelerator concentration may be in the range of 1–10 ml/l. If the second solution is a two-component solution, the accelerator concentration in the second solution may be in the range of 1–10 ml/l, whereas the suppressor concentration may be in the range of 1–10 ml/l. In other words, the process window can be very wide. This can be done because all the small features have already been filled on the wafer by the first plating step and therefore there is no danger of causing void formation in such features by these new additive concentrations, which, if used during the first stage process, would result in non-optimal filling of the small features. It should be noted that the touch-plating stage of the process may be terminated before total planarization is achieved if the degree of planarization achieved at that point is adequate for simplifying the thickness reduction process such as an electropolishing or CMP process, which follows the second stage of the deposition process.

It should be noted that, although use of two different chemistries is described here, the invention may also be used employing the same chemistry for the first and second stages of the process. In this case, however, chemistry needs to be selected to provide good quality copper for the first step and good planarization for the second step. Electrolytes with two additives (accelerator and suppressor) or electrolytes with three additives (accelerator, suppressor and leveler) where leveler concentration is low may be used for this purpose. For example, for commercially available low acid ViaForm chemistry supplied by Enthone, the standard ECD additive concentrations are accelerator of about 6 ml/l, suppressor of about 2 ml/l and leveler of about 2 ml/l. If a single 3-component chemistry is to be used for the present invention, the leveler concentration may be cut to below 1 ml/l, for example to 0.5 ml/l, not to affect negatively the planarization capability of the second step.

As an alternative, a two-component chemistry may be used in the first step using the invention to obtain a flat profile over the small features while filling completely the large features. An example of such process may be found in U.S. Provisional Application No. 60/444,355 entitled "Method of Electroplating Copper Layers with Flat Topography" filed Jan. 30, 2003, which is assigned to the assignee of the present invention. In this alternative approach, during the first stage, after filling the features having less than 10 microns width, or preferably less than 5 microns width, the filling of the wider features (>10 microns) with copper to a thickness more than "d" indicated in FIG. 8A is continued with intervals while controlling the growth rate of copper deposition over the already filled narrower features during the intervals. Controlling the local growth rate of copper deposition over the already filled narrower features may be achieved by applying a control process during the plating intervals. Application of the selected control process inhibits the formation of non-planar topography, i.e., bumps, over the copper covering the already filled small and medium size features. In this embodiment, a selected control process may be application of reverse potential pulse sequences (or pulsed wave forms) during the intervals, until the large width features are filled completely i.e. copper thickness becomes >d. The use of pulsed waveforms advantageously reduces accelerator concentrations on the surface of the copper layer, which forms over narrow width features. After this step, the second stage or the planarization step may be performed as in the manner described above. In this case the second stage can be performed in the same process chamber using the same process solution.

As shown in FIG. 8C, after the second stage of the present process, optionally a third and even a fourth step can be used to reduce the thickness of the copper layer that formed on the wafer using the previous steps. As in the previous embodiments, after the second stage of the process, the copper removal process may be performed as a third stage of the process that employs either an electrochemical etching or polishing stage or an ECME (electrochemical mechanical etching or polishing) stage. Thin planar deposits can be obtained by first depositing a planar layer using the above described two stage process, and then electroetching or electropolishing this planar film in an electroetching or polishing solution. This way the thickness of the copper layer is reduced in a planar manner, and the sacrificial copper is entirely removed, leaving a planarized primary copper 340 over the field regions 332 and the features. In fact, electroetching or electropolishing may be continued until all the primary copper on the field regions 332 is removed, confining the primary copper in the features while exposing the barrier layer 330 on the field regions. At the third stage and/or a fourth stage of the process, a third solution comprising an electroetching or electropolishing solution such as a phosphoric acid solution may be used to reduce the thickness of the copper. For example, a no-touch electroetching (third stage) may be followed by a touch ECME (fourth stage). In this respect, a fourth stage such as a touch ECME process stage may also be performed using a fourth solution.

By employing a fourth ECME or electrochemical mechanical polishing (ECMP) step, process window for copper residue removal may be opened up. In other words after the bulk of the copper is removed by electropolishing, a new solution that forms a protective layer on copper surface may be used for the electrochemical mechanical polishing step. Under applied anodic voltage this protective layer increases polarization at the copper surface, therefore decreasing electroetching or polishing. In areas where a pad makes contact with the copper surface and sweeps the protective layer, the polarization is reduced and etching/polishing is enhanced. Since pad touches the upper-most surface of the copper layer, the top of the copper layer is removed, copper surfaces that are not swept by the pad in the ECME or ECMP step gets protected by the protective layer, avoiding over-etching of these areas, and reducing dishing. These techniques may also be performed subsequent to second stage and using the second solution as an electroetching solution while reversing the polarity of the applied voltage and rendering the workpiece surface more anodic compared to the electrode.

After copper removal from the top surfaces, the barrier layer is also removed by at least one of CMP, Reactive Ion Etching (RIE) and electrochemical mechanical polishing processes to complete the formation of copper structures that are electrically isolated from each other.

Figure 9:
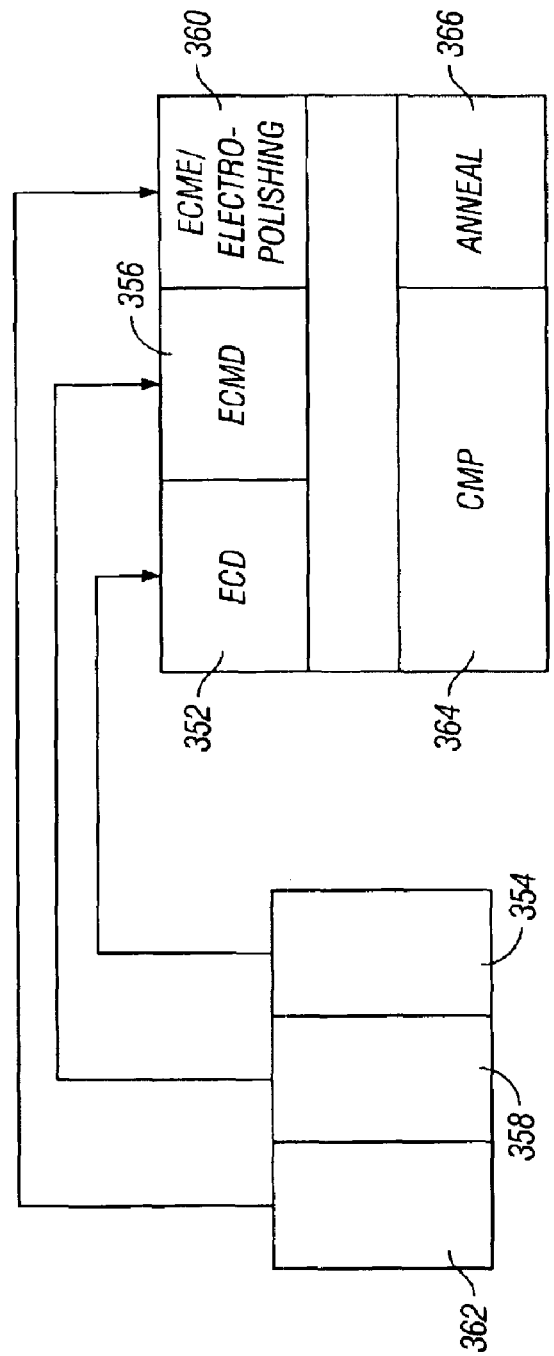
FIG. 9 illustrate an exemplary system to perform the second embodiment of the process of the present invention.

FIG. 9 exemplifies a system 350 using multiple modules such as ECD, ECMD, ECME or electropolish, CMP and anneal modules to perform the various stages of the process. The first stage of the process may be performed in an ECD module 352, using the first process solution supplied from a first supply tank 354. The second stage of the process may be performed in an ECMD module 356 using the second solution supplied from a second supply tank 358. The third stage, the electropolish stage may be performed in an electropolish chamber 360 which uses the third process solution supplied from a third supply tank 362, which may be an electroetching or electropolishing solution. However, alternatively, the third stage may be performed in an ECME or ECMP chamber. In case of using an ECME module, the electropolishing may be performed using a no-touch ECME or a touch ECME process. The third stage may also be performed in the CMP module 364. A robot would be used to transfer wafers between the various modules. An anneal module 366 can be optionally used to anneal the plated copper before or after the ECME process. Anneal can also be done after the ECD step or after both ECD and ECMD steps.

Process sequence of the present invention may also be carried out in modules that are placed in separate systems unlike one preferred embodiment shown in FIG. 9. Other processes that may be carried out during the process flow, such as rinsing and drying, edge copper removal etc., are well known in the field and have not been described here for brevity.

It should be understood, of course, that the foregoing relates to preferred embodiments of the invention and that modifications may be made without departing from the spirit and scope of the invention.

We claim:

1. A process for forming conductive structures on a semiconductor wafer having a top surface with a first feature and a second feature disposed therein, the first feature having a first width and a second feature having the widest width, the process comprising the steps:

electrochemically depositing a first conductive layer to completely fill the first feature and the second feature; and electrochemically mechanically depositing a second conductive layer over the first conductive layer to form a planar conductive layer.

2. The process of claim 1, wherein the step of electrochemically depositing includes a first electrolyte solution having a first additive composition and the step of electrochemically mechanically depositing includes a second electrolyte solution having a second additive composition.

3. The process of claim 1 further comprising the step of chemical mechanical polishing the planar conductive layer.

4. The process of claim 1 further comprising the step of electropolishing the planar conductive layer.

5. The process of claim 4, wherein the step of electropolishing removes substantially all of the planar conductive layer.

6. The process of claim 4 further comprising the step of chemical mechanical polishing the planar conductive layer.

7. The process of claim 6, wherein the chemical mechanical polishing step removes the second conductive layer from the top surface of the semiconductor wafer.

8. The process of claim 7, wherein the chemical mechanical polishing step removes the first conductive layer from the top surface of the semiconductor wafer.

9. The process of claim 8, wherein the chemical mechanical polishing step electrically isolates the first feature from the second feature.

10. The process of claim 1, wherein the step of electrochemically depositing a first conductive layer deposits the first conductive layer in the second feature to a thickness that is greater than or equal to a depth of the second feature.

11. The process of claim 2, wherein the step of electrochemically depositing a first conductive layer deposits the first conductive layer in the second feature to a thickness that is greater than or equal to a depth of the second feature.

12. The process of claim 1 further comprising the step of annealing the first conductive layer.

13. The process of claim 1 further comprising the step of annealing the second conductive layer.

14. The process of claim 1, wherein the first conductive layer and the second conductive layer are copper.

* * * * *